US007615417B2

(12) United States Patent
Manna et al.

(10) Patent No.: US 7,615,417 B2
(45) Date of Patent: Nov. 10, 2009

(54) TRIGGERED SILICON CONTROLLED RECTIFIER FOR RF ESD PROTECTION

(75) Inventors: Indrajit Manna, Singapore (SG); Lo Keng Foo, Singapore (SG); Tan Pee Ya, Singapore (SG); Raymond Filippi, Singapore (SG)

(73) Assignees: Chartered Semiconductor Manufacturing Ltd., Singapore (SG); Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/854,104

(22) Filed: Sep. 12, 2007

(65) Prior Publication Data
US 2008/0001168 A1 Jan. 3, 2008

Related U.S. Application Data

(63) Continuation of application No. 10/776,793, filed on Feb. 11, 2004, now Pat. No. 7,285,458.

(51) Int. Cl.
*H01L 21/332* (2006.01)
(52) U.S. Cl. .............................. 438/133; 257/E21.361
(58) Field of Classification Search ................ 257/107, 257/173, 174, 213, 288, 355, E21.352, E21.361; 438/142, 197, 237, 133, 134, 135, 136, 137, 438/138, 139, 140
See application file for complete search history.

(56) References Cited

U.S. PATENT DOCUMENTS

| 5,159,518 | A | 10/1992 | Roy |
| 5,453,384 | A | 9/1995 | Chatterjee |
| 5,629,544 | A | 5/1997 | Voldman et al. |
| 6,534,834 | B1 | 3/2003 | Ashton et al. |
| 6,580,184 | B2 | 6/2003 | Song |
| 6,605,493 | B1 | 8/2003 | Yu |
| 6,610,262 | B1 | 8/2003 | Peng et al. |
| 7,285,458 | B2 * | 10/2007 | Manna et al. ................ 438/237 |
| 2002/0145164 | A1 * | 10/2002 | Kunz et al. .................. 257/360 |
| 2003/0016479 | A1 | 1/2003 | Song |

OTHER PUBLICATIONS

Umesh Sharma et al., An ESD Protection Scheme for Deep Submicron ULSI Circuits, Symposium on VLSI Technology Digest of Technical Papers, 1995, pp. 85-86.
S. Voldman et al., Electrostatic Discharge (ESD) Protection in Silicon-on-Insulator (SOI) CMOS Technology with Aluminum and Copper Interconnects in Advanced Microprocessor Semiconductor Chips, EOS/ESD Symposium, 99-105, 2A.6.1 to 2A.6.11.
S. Voldman et al., Seminconductor Process and Structural Optimization of Shallow Trench Isolation-Defined and Polysilicon-Bound Source/Drain Diodes for ESD Networks, EOS/ESD Symposium, 98-151, 3A.1.1 to 2A.6.10.

* cited by examiner

*Primary Examiner*—Sue Purvis
*Assistant Examiner*—Kevin Quinto

(57) ABSTRACT

An ESD protection circuit is formed at the input/output interface contact of an integrated circuit to protect the integrated circuit from damage caused by an ESD event. The ESD protection circuit has a polysilicon bounded SCR connected between a signal input/output interface contact of the integrated circuit and a power supply connection of the integrated circuit and a biasing circuit. The biasing circuit is connected to the polysilicon bounded SCR to bias the polysilicon bounded SCR to turn on more rapidly during the ESD event. The biasing circuit is formed by at least one polysilicon bounded diode and a first resistance. Other embodiments of the biasing circuit include a resistor/capacitor biasing circuit and a second diode triggering biasing circuit.

13 Claims, 8 Drawing Sheets

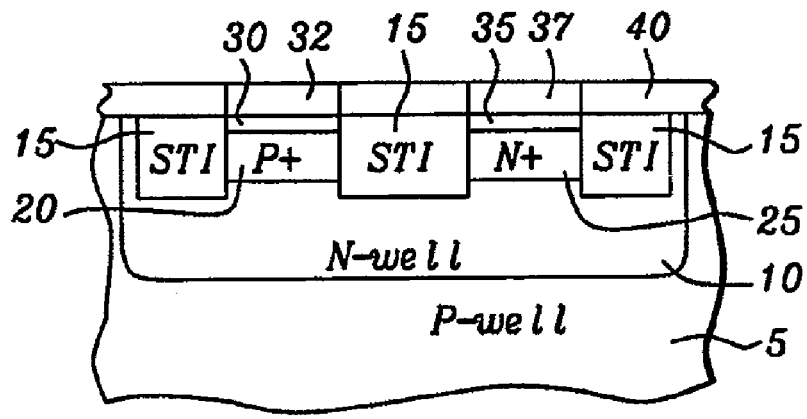
FIG. 1 - Prior Art
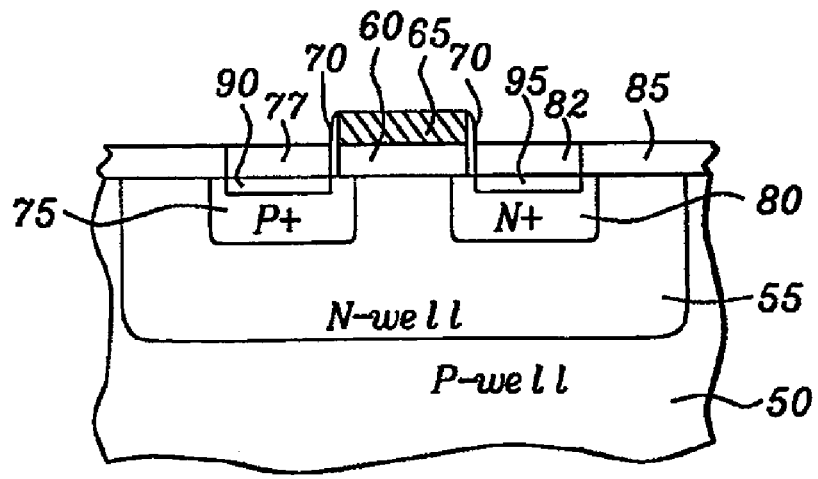
FIG. 2 - Prior Art

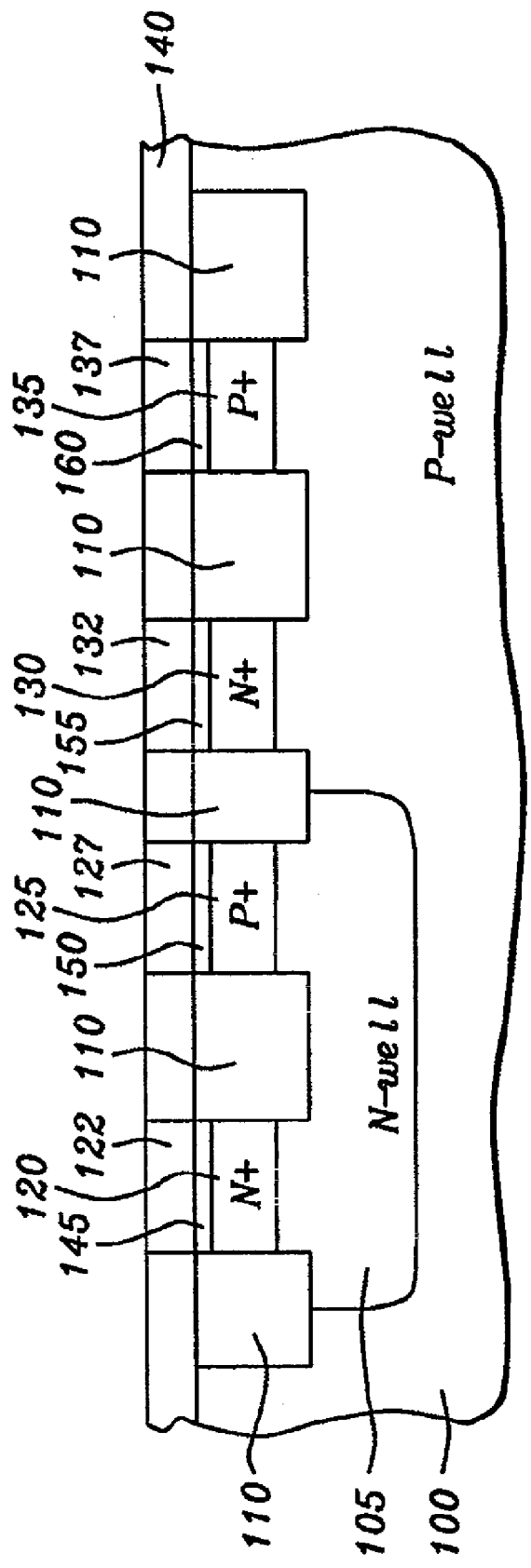
FIG. 3 - Prior Art

TRIGGERED SILICON CONTROLLED RECTIFIER FOR RF ESD PROTECTION

CROSS-REFERENCE TO RELATED APPLICATION(S)

This application is a continuation of application Ser. No. 10/776,793 filed Feb. 11, 2001, now U.S. Pat. No. 7,285,458 B2, which is hereby incorporated by reference thereto.

BACKGROUND OF THE INVENTION

1. Field of the Invention

This invention relates generally to electronic circuits, and in particular to silicon controlled rectifier (SCR) structures for electrostatic discharge protection (ESD). More particularly this invention relates to polycrystalline silicon (polysilicon) bounded SCR structures and to electronic protection circuits employing polycrystalline silicon bounded SCR's.

2. Description of Related Art

In ESD protection circuits, the series resistance of the active devices affects the performance of the devices. Higher resistance at the voltage levels of an ESD event may lead to a voltage drop across the active devices that may destroy the device. FIG. 1 shows an ESD protection diode structure of the prior art. In this example, shallow trenches are etched within the region that will become the N-well 10 and filled with an insulating material to form the shallow trench isolation (STI) 15 are formed on the substrate. A semiconductor material that is lightly doped with a p-type impurity is formed on the substrate to construct the P-well 5. Within the P-well 5, a lightly doped n-type impurity is diffused into the P-well 5 to form the N-well 10. Between two of the STI regions 15 a P-type material is diffused into the N-well until a heavily doped $P^+$ region 20 is formed. Similarly, between two other STI regions 15 an N-type material is diffused into the N-well until a heavily doped $N^+$ region 25 is formed. An insulative layer 40 is formed on the surface of the substrate and opening 32 and 37 are created over the $P^+$ region 20 and the $N^+$ region 25. Silicides 30 and 35 are respectively formed on the surfaces of the $P^+$ region 20 and $N^+$ region 25 to create the necessary contacts to external circuitry. In the case of the ESD protection diodes shown, the contacts will be to the signal input/output interface connection pads and the power supply voltage source connection pads.

According to U.S. Pat. No. 5,629,544 (Voldman, et al.—544), diode series resistance is largely determined by the dimensions of the diode features, the resistivity of N-well 10 in which diode is located, the distance current flows in N-well 10 and the depth of the current path, and by the resistance of contacts 30 and 35 to the p+ and n+ diffusions 20 and 25. Thus, a wider diode with a lower well resistivity, a shorter current path, and silicided films and contacts provide a lower diode series resistance. In the case of the diode as shown, the depth of the current path is determined by the depth of the STI regions 15. Further, it is known in the art that the width of the STI regions 15 have certain achievable minimums that cause the series resistance to be larger than desired.

Voldman, et al.—544 and "Semiconductor Process and Structural Optimization of Shallow Trench Isolation-Defined And Polysilicon-Bound Source/Drain Diodes For ESD Networks," Voldman, et al., Proceedings Electrical Overstress/Electrostatic Discharge Symposium, October 1998, pp: 151-160 discusses polysilicon-bounded diode. Refer to FIG. 2 for more discussion of the structure of a polysilicon bounded diode. The structure of the polysilicon bounded diode is constructed in a P-type well 5 that has been created with a substrate has been lightly doped with a p-type impurity. Within the P-well 5 a lightly doped n-type impurity is diffused into the P-well 5 to form the N-well 10. An insulative layer 40 is formed on the surface of the substrate. A gate stack is formed with a gate oxide layer 60 and a polysilicon layer 65. Spacers 70 are added to the sides of the gate oxide layer 60 and the polysilicon layer 65. A P-type material is diffused into the N-well until a heavily doped $P^+$ region 75 is formed and an N-type material is diffused into the N-well until a heavily doped $N^+$ region 80 is formed on each side of the gate stack. Openings 77 and 82 are created over the $P^+$ region 75 and the $N^+$ region 80. Silicides 90 and 95 are respectively formed on the surfaces of the $P^+$ region 75 and $N^+$ region 80 to create the necessary contacts to external circuitry. As described above, the contacts will be to the signal input/output interface connection pads and the power supply voltage source connection pads.

In the polysilicon bounded diode as shown, the gate stack maybe constructed with smaller dimensions than those permitted in the diode constructed with the STI 15 of FIG. 1. This permits the series resistance of the diode to be lower to and thus improves the operation of the diode during an ESD event.

Use of silicon controlled rectifiers (SCR) as ESD protection devices are well known in the art. Referring to FIG. 3, the P-well 100 is constructed of a semiconductor material that is lightly doped with a p-type impurity is diffused into a substrate. Within the P-well 100 a lightly doped n-type impurity is diffused into the P-well 100 to form the N-well 105. Shallow trenches are then etched within the region of the N-well 105 and filled with an insulating material to form the shallow trench isolation (STI) 110. Between two of the STI regions 110 a P-type material is diffused into the N-well until a heavily doped $P^+$ regions 125 and 135 are formed. Similarly, between two other STI regions 110 an N-type material is diffused into the N-well until the heavily doped $N^+$ regions 120 and 130 are formed. An insulative layer 140 is formed on the surface of the substrate and openings 127 and 137 are created over the $P^+$ regions 125 and 135 and openings 122 and 132 are created over the $N^+$ regions 120 and 130. Silicides 145, 150, 155, and 160 are formed on the surfaces of the $P^+$ regions 125 and 135 and $N^+$ regions 120 and 130 to create the necessary contacts to external circuitry. The contacts will be to the signal input/output interface connection pads and the power supply voltage source connection pads.

The SCR is formed of the $P^+$ regions 125, the N-well 105, the P-well 105 and the $N^+$ regions 130. The anode of the SCR being the $P^+$ regions 125 and the cathode $N^+$ regions 130. As structured, a positive voltage of an ESD event applied to the anode will cause the SCR to be activated once the snapback voltage is reached. In general the snapback voltage as shown is greater than 50V and may not cause damage to connected integrated circuits. However, as the feature sizes of integrated circuits have become smaller, the voltages at which damage may occur is becoming smaller and the SCR needs to be triggered at lower voltages that are greater than the operating voltages of the integrated circuits.

"Electrostatic Discharge (ESD) Protection in Silicon-On-Insulator (SOI) CMOS Technology with Aluminum and Copper Interconnects in Advanced Microprocessor Semiconductor Chips," Voldman, et al., Proceedings Electrical Overstress/Electrostatic Discharge Symposium, 1999, pp: 105-115, discusses the electrostatic discharge (ESD) robustness of silicon-on-insulator (SOI) high-pin-count high-performance semiconductor chips. The ESD results demonstrate that sufficient ESD protection levels are achievable in SOI microprocessors using lateral ESD SOI polysilicon-bound gated diodes.

"An ESD Protection Scheme for Deep Sub-Micron ULSI Circuits," Sharma, et al. Digest of Technical Papers—1995 Symposium on VLSI Technology, 1995. pp: 85-86, describes a scheme for on-chip protection of sub-micron ULSI circuits against ESD stress using low voltage zener-triggered SCR, and a zener-triggered thin gate oxide MOSFET.

U.S. Pat. No. 6,610,262 (Peng, et al.) describes an ESD semiconductor protection with reduced input capacitance.

U.S. Pat. No. 6,605,493 (Yu) teaches about an SCR ESD protection device used with shallow trench isolation structures. The invention incorporates polysilicon gates bridging SCR diode junction elements and also bridging between SCR elements and neighboring STI structures. The presence of the strategically located polysilicon gates effectively counters the detrimental effects of non-planar STI "pull down" regions as well as compensating for the interaction of silicide structures and the effective junction depth of diode elements bounded by STI elements. Connecting the gates to appropriate voltage sources such as the SCR anode input voltage and the SCR cathode voltage, typically ground, reduces normal operation leakage of the ESD protection device.

U.S. Pat. No. 6,580,184 (Song) illustrates an ESD protection circuit having a silicon-controlled rectifier structure. A switch circuit is connected between a ground voltage terminal and a well region that is a base of the PNP transistor. The switch circuit is formed of plural diode-coupled MOS transistors, so that a trigger voltage of the SCR is determined by threshold voltages of the MOS transistors.

U.S. Pat. No. 6,534,834 (Ashton, et al.) teaches about a snapback device that functions as a semiconductor protection circuit to prevent damage to integrated circuits resulting from events such as electrostatic discharge. The snapback device includes a polysilicon film overlapping the active area.

U.S. Pat. No. 5,453,384 (Chatterjee) describes a silicon controlled rectifier structure that is provided for electrostatic discharge protection. A polysilicon gate layer is formed over a gate insulator region and is electrically coupled to the input pad of an integrated circuit.

U.S. Pat. No. 5,159,518 (Roy) details an input protection circuit that protects MOS semiconductor circuits from electrostatic discharge voltages and from developing circuit latchup. The input protection circuit includes a low resistance input resistor, and two complementary true gated diodes.

United States Patent Application 2003/0016479 (Song) describes an ESD protection circuit having silicon-controlled rectifier structure that includes a PNP transistor and an NPN transistor. A switch circuit is connected between a ground voltage terminal and a well region that is a base of the PNP transistor. The switch circuit is formed of plural diode-coupled MOS transistors, so that a trigger voltage of the SCR is determined by threshold voltages of the MOS transistors.

SUMMARY OF THE INVENTION

An object of this invention is to provide an ESD protection circuit that becomes activated at a voltage sufficient to protect integrated circuits connected to the protection circuit.

Another object of this invention is to provide an ESD protection circuit with a polysilicon bounded SCR that conducts of applied energy resulting from an ESD event to an input/output interface connection pad.

Still another object of this invention is to provide a bias triggering circuit for an SCR that causes the SCR to turn on at a lower voltage in order to conduct the energy of an ESD event.

A further object of this invention is to provide a diode bias triggering circuit for an SCR that causes the SCR to turn on at a lower voltage in order to conduct the energy of an ESD event.

One more object of this invention is to provide a resistor/capacitor triggering circuit for an SCR that causes the SCR to turn on at a lower voltage to conduct the energy of an ESD event.

To accomplish at least one of these objects, an ESD protection circuit is formed at the input/output interface contact of an integrated circuit to protect the integrated circuit from damage caused by an ESD event. The ESD protection circuit has a polysilicon bounded SCR and a biasing circuit. The polysilicon bounded SCR is connected between a signal input/output interface contact of the integrated circuit and a power supply connection of the integrated circuit. The biasing circuit is connected to the polysilicon bounded SCR to bias the polysilicon bounded SCR to turn on more rapidly during the ESD event.

The polysilicon bounded SCR includes a first well region lightly doped with impurities of a first conductivity type formed on the substrate and connected to the power supply connection and a second well region formed within the first well region and lightly doped with impurities of a second conductivity type. A first diffusion region is formed within the second well by heavily doping the region with the impurities of the first conductivity type. The first diffusion region is connected to the signal input/output interface contact. A second diffusion region is formed within the first well region at a second distance from the first diffusion region by heavily doping the region with impurities of the second conductivity type. The second diffusion region is connected to the power supply connection. A first heavily doped polycrystalline layer is formed at the surface of the substrate and placed between the first and second diffusion regions and astride a junction of the first well region and the second well region to form a bounding component to prevent silicide formation at junctions of the first diffusion region and the second well region, the first well region and the second region and the second diffusion region and the first well region during fabrication of the SCR.

The SCR being the junctions of the first diffusion region and the second well region, the junction of the first and second well regions, and the junction of the first well region and the second diffusion region. The anode of the SCR is the first well region and the cathode of the SCR is the second diffusion region.

The biasing circuit is formed of at least one polysilicon bounded diode formed on the substrate and connected between the signal input/output interface contact and an anode connection of the polysilicon bounded SCR to increase a holding voltage for the polysilicon bounded SCR when the polysilicon bounded SCR is turned on.

The polysilicon bounded diode is formed from the first diffusion region and the second well region and has a second heavily doped polysilicon layer formed at the surface of the substrate and placed adjacent to the first diffusion region and astride a junction of the second well region and first diffusion region to form a bounding component to prevent silicide formation at the junction of the first diffusion region and the second well region during fabrication of the polysilicon bounded diode. The junction of the first diffusion region and the second well region forms the polysilicon bounded diode.

The biasing circuit has a first resistance formed by material from the second well from a first gate of the polysilicon bounded SCR to a third diffusion region formed within the second well, heavily doped with the impurities of the second conductivity type, and connected to the power supply connection to provide a low resistance path to the second well from the power supply connection. The biasing circuit further has a second resistance formed material of the second well from the first gate to the first diffusion region.

A second embodiment of the biasing circuit includes a first resistor connected from the signal input/output interface contact to the first gate of the polysilicon bounded SCR and a first capacitor connected from the first gate of the polysilicon bounded SCR to the power supply connection. When an ESD event occurs, a top plate of the capacitor connected to the gate of the polysilicon bounded SCR is a virtual ground and the polysilicon bounded SCR is activated.

A third embodiment of the biasing circuit has a plurality of serially connected diodes. The first diode of the plurality of serially connected diodes is connected to the signal input/output interface contact and the last diode of the plurality of the serially connected diodes is connected to a second gate of the polysilicon bounded SCR. The biasing circuit further has a second resistor connected from the second gate and the last diode of the plurality of serially connected diodes to the power supply connection. When an ESD event occurs, a current flows through the plurality of serially connected diodes and the second resistor, which triggers the polysilicon bounded SCR to turn on.

A fourth embodiment of the biasing circuit: includes a resistor/capacitor biasing circuit connected from the first gate of the polysilicon bounded SCR and a diode triggering biasing circuit connected from the second gate of the polysilicon bounded SCR. The resistor/capacitor biasing circuit has a first resistor connected from the signal input/output interface to the first gate of the polysilicon bounded SCR and a first capacitor connected from the first gate of the polysilicon bounded SCR to the power supply connection. The diode triggering biasing circuit has a plurality of serially connected diodes. The first diode of the plurality of serially connected diodes is connected to the signal input/output interface contact and the last diode of the plurality of serially connected diodes is connected to a second gate of the polysilicon bounded SCR. The diode triggering biasing circuit has a second resistor connected from the second gate and the last diode of the plurality of serially connected diodes to the power supply connection.

When an ESD event occurs, the top plate of the capacitor connected to the gate of the polysilicon bounded SCR is a virtual ground and the polysilicon bounded SCR is activated. Simultaneously, a current flows through the plurality of serially connected diodes and the second resistor to trigger the polysilicon bounded SCR to turn on.

The heavily doped polycrystalline layer of the polysilicon bounded SCR and the polysilicon bounded diode permits a series resistance of the polysilicon bounded SCR and the polysilicon bound diode to be smaller for a more efficient operation. The heavily doped polycrystalline layer is connected to bias the heavily doped polysilicon layer such that salicide shorting is prevented the first and second diffusion regions and preventing of accidental formation of an inversion region heavily doped polycrystalline layer.

BRIEF DESCRIPTION OF THE DRAWINGS

FIG. 1 is a cross sectional view of a substrate illustrating an ESD protection diode structure of the prior art.

FIG. 2 is a cross sectional view of a substrate illustrating a polysilicon bounded ESD protection diode structure of the prior art.

FIG. 3 is a cross sectional view of a substrate illustrating an ESD protection SCR structure of the prior art.

DETAILED DESCRIPTION OF THE INVENTION

Figure 4A:
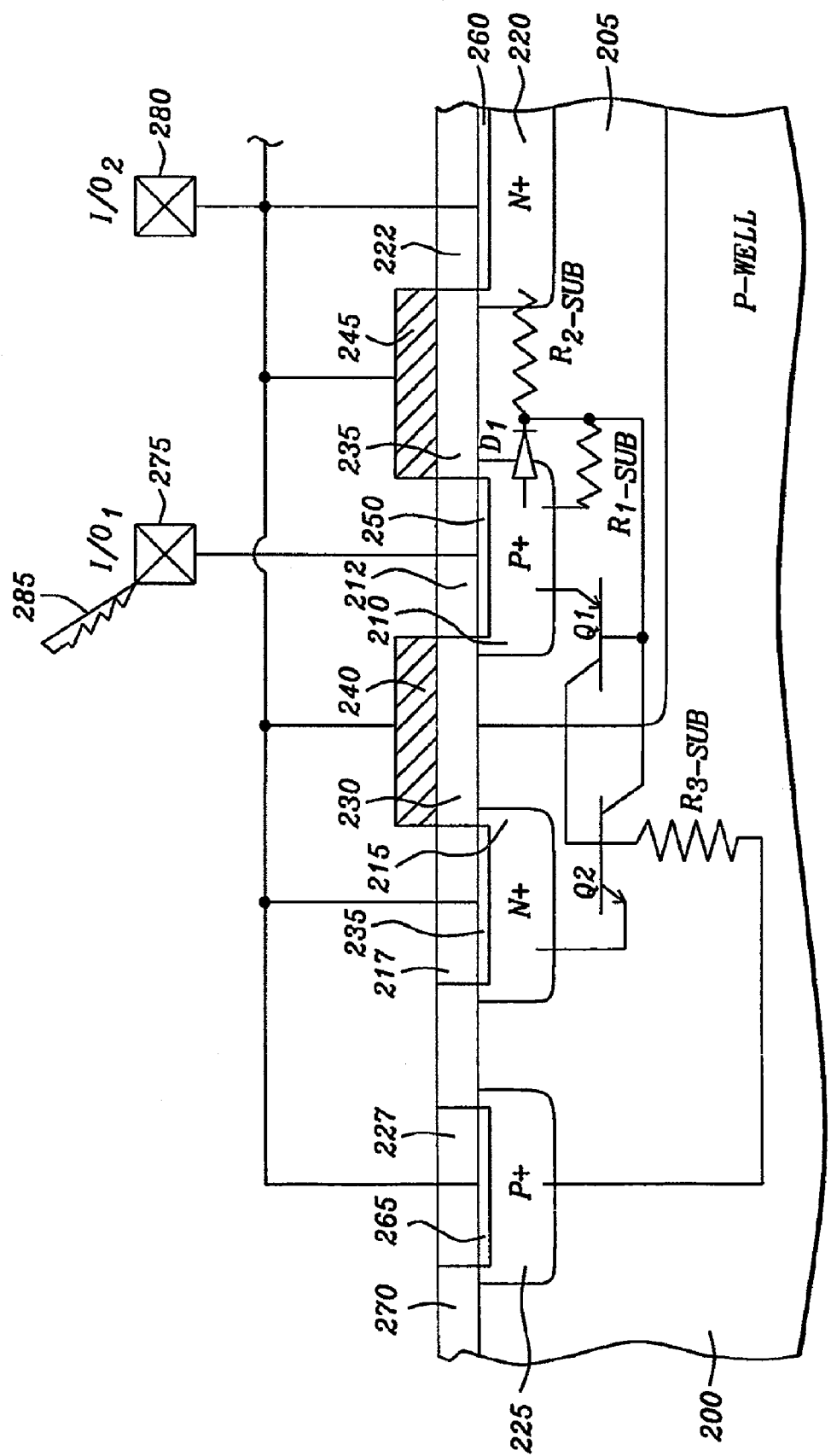
FIG. 4a is a cross sectional view of a substrate illustrating an ESD protection polysilicon bounded SCR structure of this invention.
Figure 4B:
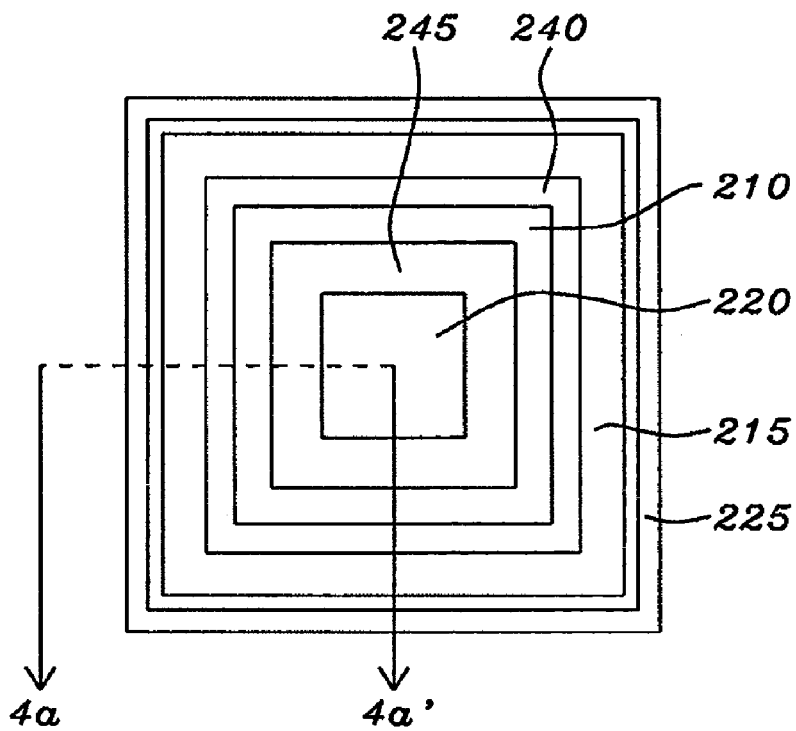
FIG. 4b is a top plan view of a substrate illustrating an ESD protection polysilicon bounded SCR structure of this invention.

The polysilicon bounded SCR of this invention as shown in FIGS. 4a and 4b includes a P-well 200 lightly doped with p-type impurities formed on the substrate and connected to the power supply connection 280 through the $P^+$ diffusion 225. An N-well region 205 is formed within the P-well 200 and lightly doped with N-type impurities and connected through the $N^+$ diffusion region 220 to the power supply connection 280. A $P^+$ diffusion region 210 is formed within the N-well 205 by heavily doping the N-well 205 with the P-type impurities. The $P^+$ diffusion region 210 is connected to the signal input/output interface contact 275. An $N^+$ diffusion region 215 is formed within the P-well 200 at a second distance from the $N^+$ diffusion region 210 by heavily doping the P-well 200 with N-type impurities. The $N^+$ diffusion 215 is also connected to the power supply connection 280.

An insulative material such as a silicon dioxide is formed on the surface of the substrate between the $P^+$ diffusion region 210 and the $N^+$ diffusion region 215 and astride a junction of the P-well 200 to form a gate oxide 230. A polysilicon layer is then formed on the gate oxide 230 to form the gate structure 240. The gate structure 240 forms a bounding component to prevent silicide formation at junctions of the $P^+$ diffusion region 210 and the N-well region 205, the P-well 200 and the N-well region 205 and the $N^+$ diffusion region 215 and the P-well 200 during fabrication of the SCR.

As is known in the art, an SCR is regarded as a PNP transistor Q1 connected serially with an NPN transistor Q2. Thus, the collector of the PNP transistor Q1 is the P-well 200, the base is the N-well 205, and the emitter is the $P^+$ diffusion region 210. The collector of the NPN transistor Q2 is the N-well 205, the base is the P-well 200, and the emitter is the $N^+$ diffusion region 215. with the junctions being the boundaries between the $P^+$ diffusion region 210 and the N-well region 205, the P-well 200 and the N-well region 205 and the N+ diffusion region 215 and the P-well 200.

A N+ diffusion region 220 is formed within the N-well 205 by heavily doping the N-well 205 with the N-type impurities and the P+ diffusion region 225 is formed within the P-well 200 by heavily doping the P-well 200 with the P-type impurities. An insulation layer 270 is formed on the surface of the substrate to protect the surface. Openings 227, 217, 212, and 222 are made in the insulation layer 270 to respectively provide access to the P+ diffusion region 225, N+ diffusion region 215, P+ diffusion region 210, and N+ diffusion region 220. A silicide contact 265, 255, 250, and 260 is formed respectively on the surface of each of the P+ diffusion region 225, N+ diffusion region 215, P+ diffusion region 210, and N+ diffusion region 220. The silicide contacts 255 and 250 are restricted or bounded by the polysilicon gate structure 240.

The diode $D_1$ is formed as the junction of the P+ diffusion region 210 and the N-well 205. The gate oxide 235 is formed between and slightly overlaps the P+ diffusion region 210 and the N+ diffusion region 220. A polysilicon layer is formed on the gate oxide 235 to form the gate structure 245. The gate structure 245 provides bounding for the silicide contacts 250 and 260. The polysilicon bounding gate structures 240 and 245 permit the P+ diffusion region 210 and N+ diffusion region 215 to be placed relatively close by avoiding the necessity for a larger shallow trench isolation, thus minimizing the serial resistance of the diode $D_1$ and the SCR formed by the transistors Q1 and Q2.

The gate structures 240 and 245 are connected to the power supply connection 280 to prevent salicide shorting between the silicide contacts 265 and 250 and silicide contacts 250 and 260 and preventing of accidental formation of an inversion region under said first and second diffusion regions. The silicide contacts 265, 255, and 260 provide low resistivity connections for the P+ diffusion region 225, N+ diffusion region 215, and N+ diffusion region 220 to the power supply connection 280. The silicide contact provides a low resistivity connection for the P+ diffusion region 210 to the signal input/output interface pad 275.

Figure 5:
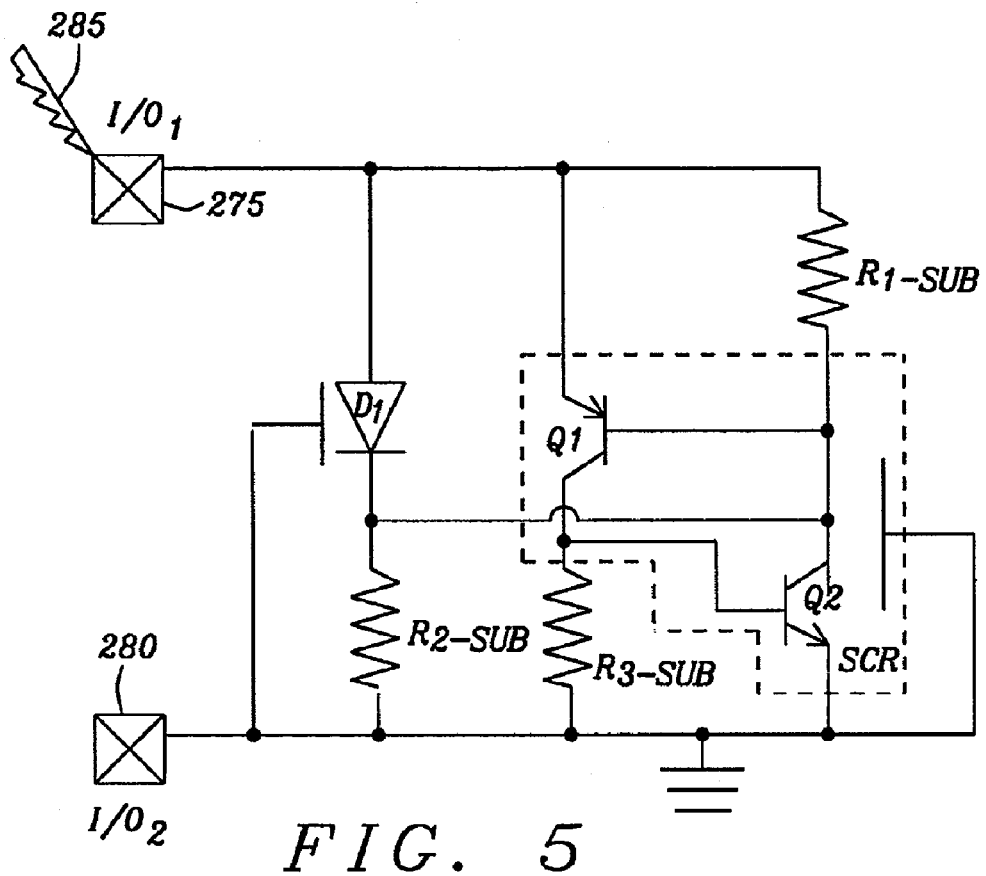
FIG. 5 is a schematic of a diode triggered ESD protection circuit of this invention incorporating ESD protection polysilicon bounded SCR structure.

Refer now additionally to FIG. 5 for a discussion of the circuit structure of the polysilicon bounded SCR having a diode triggering of this invention. As described above, the diode $D_1$ is formed as the junction of the P+ diffusion region 210 and the N-well 205. The polysilicon bounded SCR is formed of the P-well 200, the N-well 205, the P+ diffusion region 210, the N-well 205, the P-well 200, and the N+ diffusion region 215. The resistor $R_{1-SUB}$ is the bulk resistance of the N-well 205 to the P+ diffusion region 210. The resistor $R_{2-SUB}$ is the bulk resistance of the N-well 205 to the N+ diffusion region 220. And the resistor $R_{3-SUB}$ is the bulk resistance of the P-well 200 to the P+ diffusion region 225.

Upon application of the voltage of an ESD event to the input/output interface pad 275, the diode $D_1$ begins to conduct. The current through the resistance $R_{2-SUB}$ develops sufficient voltage to turn on the transistor Q1, which in turn provides a current through the resistor $R_{3-SUB}$. This develops a voltage sufficient to turn on the transistor Q2, thus completely activating the SCR.

Figure 4C:
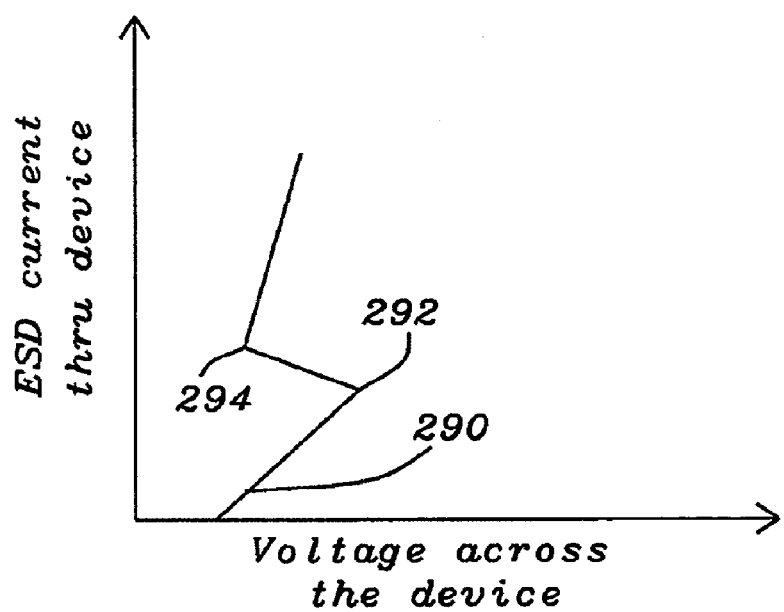
FIG. 4c is a plot of current through an ESD protection polysilicon bounded SCR structure of this invention versus the voltage across the ESD protection polysilicon bounded SCR structure of this invention.

Referring to FIG. 4c, as the voltage applied between the anode (P+ diffusion region 210) and the cathode (N+ diffusion region 215) of the Polysilicon bounded SCR increases the current rises slowly 290 until the biasing of the diode $D_1$ and the resistor $R_{2-SUB}$ turns on the SCR at the snapback point 292. At the current and voltage level 294 the SCR fundamentally acts as a resistor, with the resistance determined by the internal resistance of the SCR. The internal resistance is then determined by the dimensions of the SCR and the proximity of the P+ diffusion region 210 and the N+ diffusion region 215. The polysilicon gate structures 240 and 245 allow current to flow laterally between the P+ diffusion region 210 and the N+ diffusion region 215 more efficiently with a lower resistance to prevent ohmic heating of the device.

Figure 6:
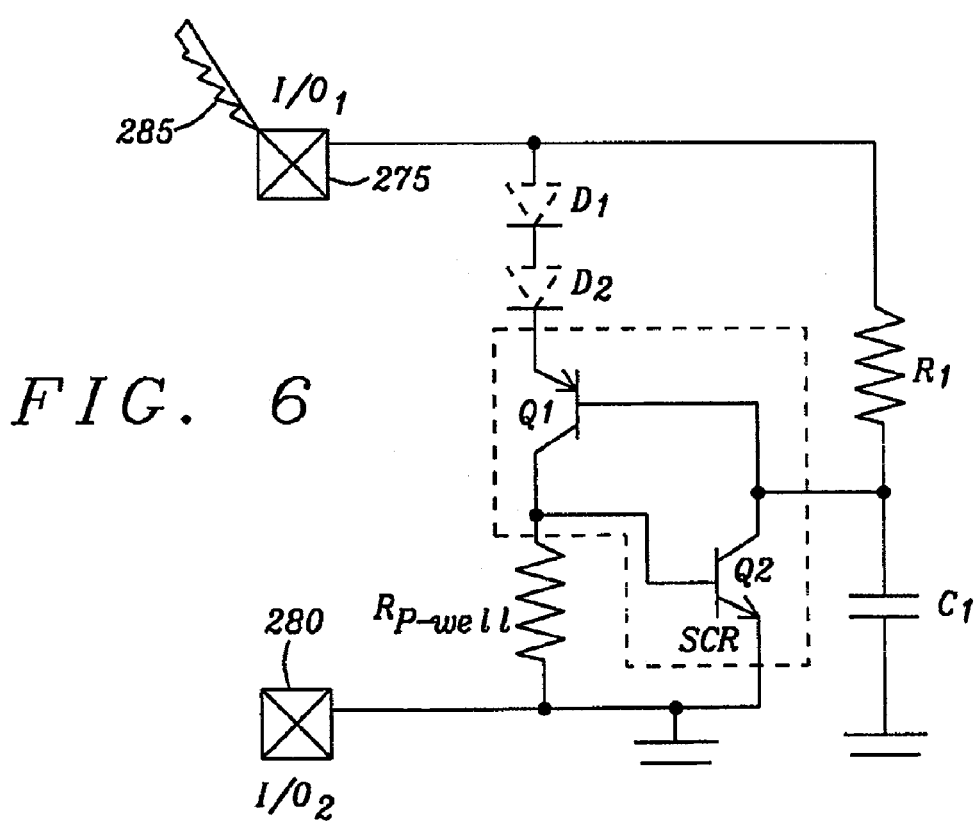
FIG. 6 is a schematic of a resistor/capacitor triggered ESD protection circuit of this invention incorporating ESD protection polysilicon bounded SCR structure.

A second embodiment of the ESD protection circuit, as shown in FIG. 6 is connected between the signal input/output interface pad 275 and the power supply connection pad 280. The SCR is formed as described in FIGS. 4a and 4b. The diodes $D_1$ and $D_2$ are optional diodes placed in series with the SCR between the signal input/output interface pad 275 and the SCR. These diodes are structured as the diode $D_1$ of the FIG. 4a and increase the holding voltage of the SCR when it is turned on. The base of the transistor Q1 and the collector of the transistor Q2 is the N-well 205 of FIG. 4a and will be referred to as the first gate of the SCR. The base of the transistor Q2 and the collector of the transistor Q1 is the P-well 200 of FIG. 4a and is referred to as the second gate of the SCR. The resistor $R_1$ is connected between the signal input/output interface pad 275 and the first gate. The capacitor $C_1$ is connected from the first gate to the power supply connection pad 280. In this example the power supply connection pad 280 is the ground reference point for the integrated circuit.

The resistor $R_{P-WELL}$ is the bulk resistance of the P-well 200 of FIG. 4a and is connected from the second gate of the SCR and the power supply connection pad 280. The resistor $R_1$ is constructed using any known technique such as a highly doped diffusion region. The capacitance is constructed using any known technique such as employing a gate to bulk capacitance of a MOSFET as the capacitor $C_1$.

When an ESD event 285 occurs, the voltage at the signal input/output interface pad 285 increases dramatically. The top plate of the capacitor $C_1$ at the first gate is at a virtual ground, thus causing the transistor Q1 to turn on, which causes the current through the resistor $R_{P-WELL}$ to increase and turn on the transistor Q2. The SCR then transfers the energy to the power supply connection pad 280.

Figure 7:
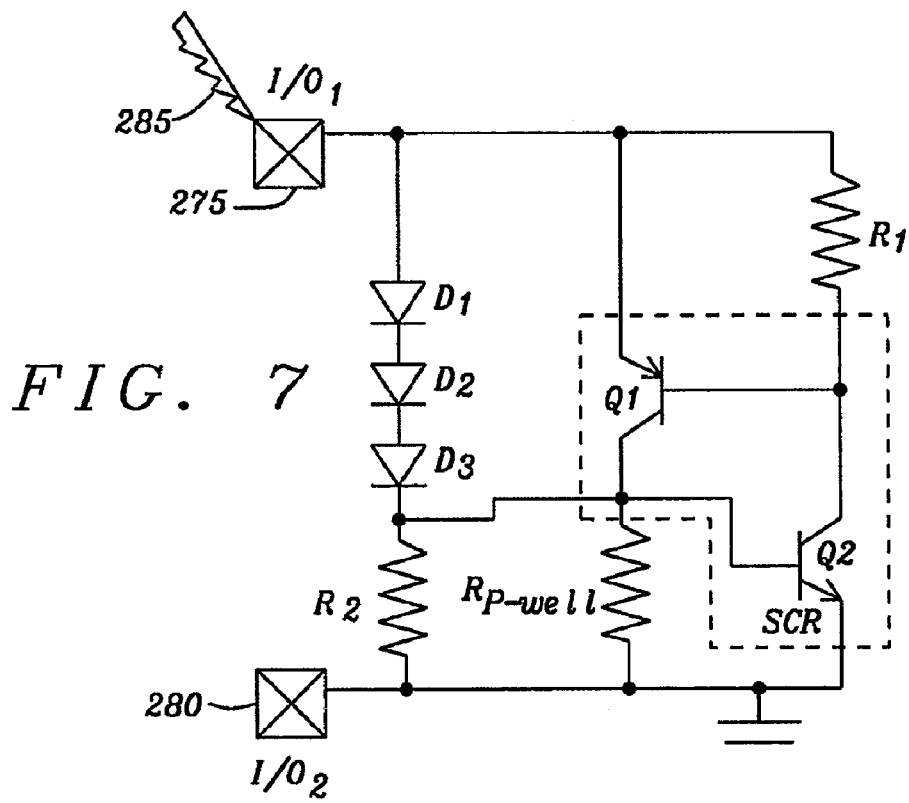
FIG. 7 is a schematic of a second diode triggered ESD protection circuit of this invention incorporating ESD protection polysilicon bounded SCR structure.

A third embodiment of the ESD protection circuit, as shown in FIG. 7 is connected between the signal input/output interface pad 275 and the power supply connection pad 280. The SCR is formed as described in FIGS. 4a and 4b. As described above, the base of the transistor Q1 and the collector of the transistor Q2 is the N-well 205 of FIG. 4a and is referred to as the first gate of the SCR. The base of the transistor Q2 and the collector of the transistor Q1 are the P-well 200 of FIG. 4a and is referred to as the second gate of the SCR.

The diodes $D_1$, $D_2$, and $D_3$ are serially connected from cathode to anode and are structured as the diode $D_1$ of the FIG. 4a. The anode of the first diode $D_1$ is connected to the signal input/output interface pad 275 and the cathode of the last diode $D_3$ is connected to the second gate of the SCR. The resistor $R_2$ is connected to the second gate of the SCR and the cathode of the last diode $D_3$. It should be noted that while this embodiment is implemented with the three diodes $D_1$, $D_2$, and $D_3$, there may be any number of diodes connected serially. The number being determined by the operational voltages of the integrated circuits connected to the signal input/output interface pad 275.

The resistor $R_{P-WELL}$ is the bulk resistance of the P-well 200 of FIG. 4a and is connected from the second gate of the SCR and the power supply connection pad 280. The resistors $R_1$ and $R_2$ are constructed using any known technique such as a highly doped diffusion region.

When an ESD event 285 occurs, the voltage at the signal input/output interface pad 285 increases dramatically. The diodes $D_1$, $D_2$, and $D_3$ begin to conduct and a voltage is developed across the resistors R2 and $R_{P-WELL}$. The transistor Q2 turns on causing current to flow through the resistor $R_1$. The voltage developed across the resistor $R_1$ turns on the transistor Q2. The SCR is thus activated to conduct the energy of the ESD event from the integrated circuits connected to the signal input/output interface pad 275 to the power supply connection pad 280.

Figure 8:
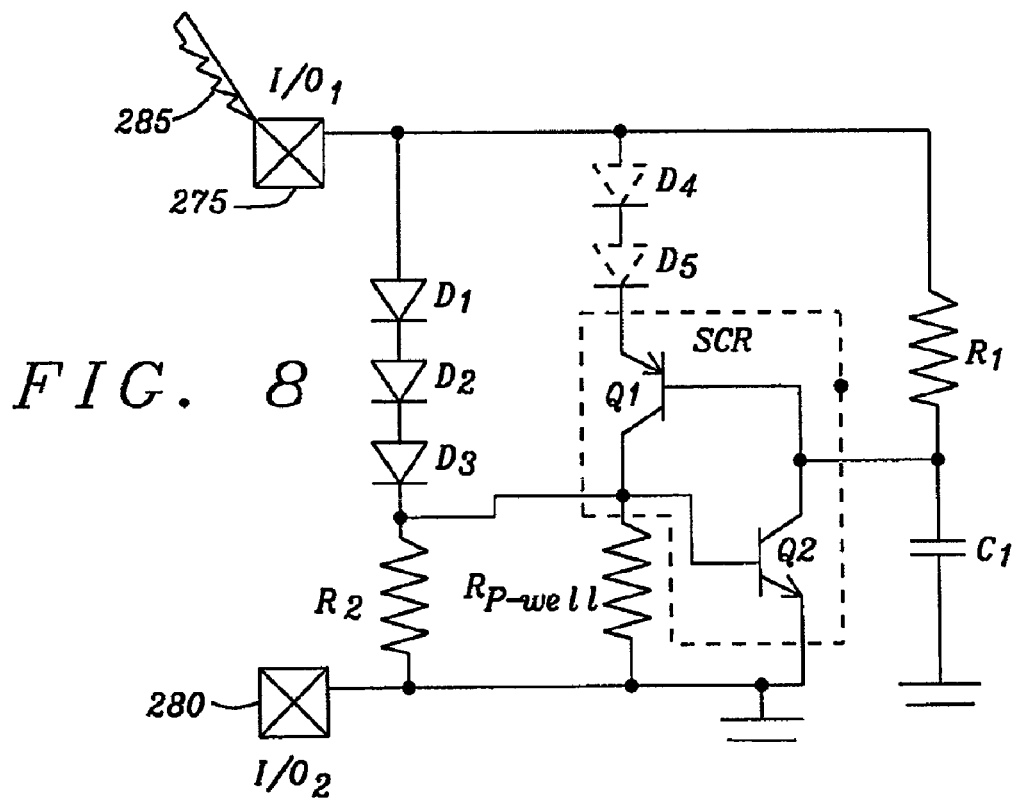
FIG. 8 is a schematic of a resistor/capacitor triggered and diode triggered ESD protection circuit of this invention incorporating ESD protection polysilicon bounded SCR structure.

A fourth embodiment of the ESD protection circuit, as shown in FIG. 8 is connected between the signal input/output interface pad 275 and the power supply connection pad 280. This embodiment incorporates the triggering bias circuits of the second and third embodiments. Further, the optional diodes $D_1$ and $D_2$ of the second embodiment are included as the diodes $D_4$ and $D_5$ and placed in series with the SCR between the signal input/output interface pad 275 and the SCR. These diodes are structured as the diode $D_1$ of the FIG. 4a and increase the holding voltage of the SCR when it is turned on.

The SCR is formed as described in FIGS. 4a and 4b. The base of the transistor Q1 and the collector of the transistor Q2 is the N-well 205 of FIG. 4a and will be referred to as the first gate of the SCR. The base of the transistor Q2 and the collector of the transistor Q1 are the P-well 200 of FIG. 4a and are referred to as the second gate of the SCR.

The resistor/capacitor triggering circuit is formed by the resistor R1 and capacitor C1. The resistor $R_1$ is connected between the signal input/output interface pad 275 and the first gate and the capacitor $C_1$ is connected from the first gate to the power supply connection pad 280. In this example, the power supply connection pad 280 is the ground reference point for the integrated circuit.

As described above, the resistor $R_1$ is constructed using any known technique such as a highly doped diffusion region. The capacitance is constructed using any known technique such as employing a gate to bulk capacitance of a MOSFET as the capacitor $C_1$.

The diode triggering circuit includes the serially connected diodes $D_1$, $D_2$, and $D_3$ and the resistor $R_2$. The diodes $D_1$, $D_2$, and $D_3$ are serially connected cathode to anode and are structured as the diode $D_1$ of the FIG. 4a. The anode of the first diode $D_1$ is connected to the signal input/output interface pad 275 and the cathode of the last diode $D_3$ is connected to the second gate of the SCR. The resistor $R_2$ is connected to the second gate of the SCR and the cathode of the last diode $D_3$. As noted above, that while this embodiment is implemented with the three diodes $D_1$, $D_2$, and $D_3$, there may be any number of diodes connected serially. The number is determined by the operational voltages of the integrated circuits connected to the signal input/output interface pad 275.

The resistor $R_{P-WELL}$ is the bulk resistance of the P-well 200 of FIG. 4a and is connected from the second gate of the SCR and the power supply connection pad 280. The resistor $R_2$ is constructed using any known technique such as a highly doped diffusion region.

When an ESD event 285 occurs, the voltage at the signal input/output interface pad 285 increases dramatically. The diodes $D_1$, $D_2$, and $D_3$ begin to conduct and a voltage is developed across the resistors $R_1$ and $R_{P-WELL}$. The transistor Q2 turns on. Simultaneously, the top plate of the capacitor $C_1$ at the first gate is at a virtual ground, thus causing the transistor Q1 to turn on, thus activating the SCR. The SCR then transfers the energy to the power supply connection pad 280.

Figure 9:
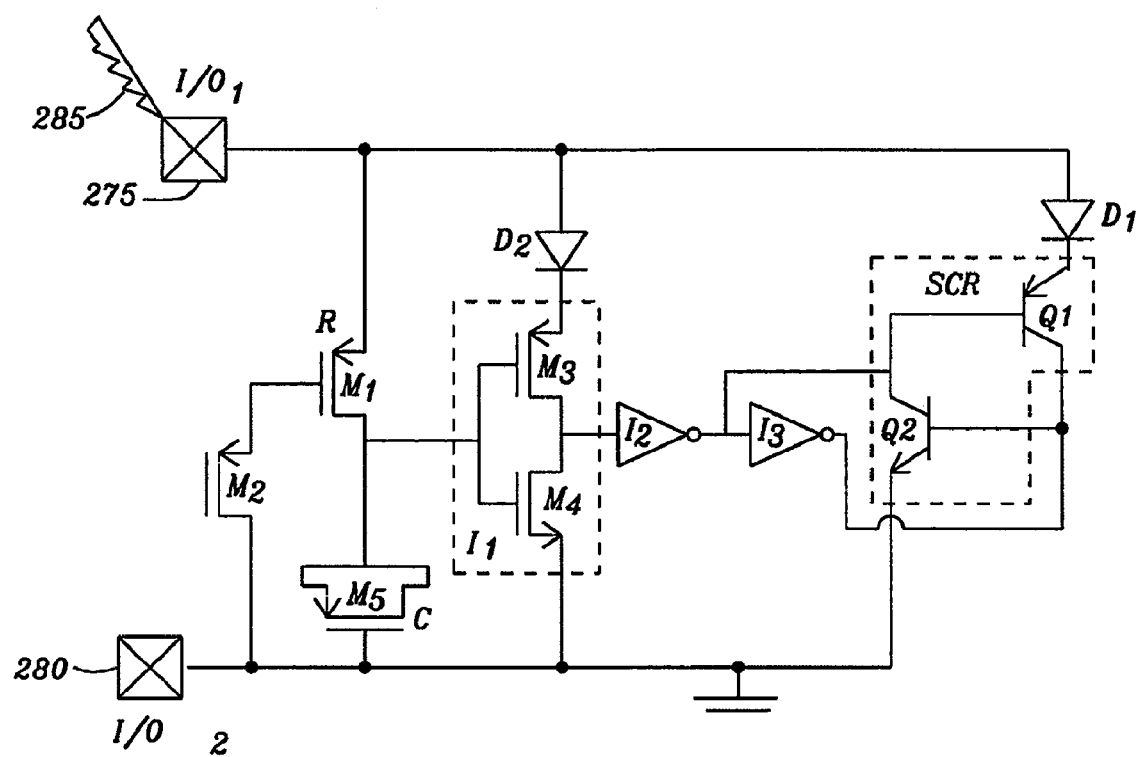
FIG. 9 is a schematic of a third diode triggered ESD protection circuit of this invention incorporating an ESD protection polysilicon bounded SCR structure.

A fifth embodiment of the ESD protection circuit, as shown in FIG. 9 is connected between the signal input/output interface pad 275 and the power supply connection pad 280. In this embodiment, the triggering bias circuit is a resistor R and capacitor C that are formed of a first metal oxide semiconductor (MOS) transistor $M_1$ biased to act as the resistor R and a second MOS transistor $M_5$ connected to form the capacitor C. The MOS transistor $M_2$ connected to bias the MOS transistor $M_1$ to an on condition to act as the resistor R. The junction connection between the resistor R and capacitor C is connected to an input terminal of a first inverter $I_1$ of a group of serially connected inverters $I_1$, $I_2$, and $I_3$. In this embodiment the preferred implementation of the group of serially connected inverters $I_1$, $I_2$, and $I_3$ is shown as three inverters however, the number of inverters maybe adjusted according to the requirements of the design.

The SCR is formed as described in FIGS. 4a and 4b. The base of the transistor Q1 and the collector of the transistor Q2 is the N-well 205 of FIG. 4a and will be referred to as the first gate of the SCR. The base of the transistor Q2 and the collector of the transistor Q1 are the P-well 200 of FIG. 4a and are referred to as the second gate of the SCR.

Each of the group of serially connected inverters $I_1$, $I_2$, and $I_3$ is formed as shown for the inverter $I_1$. The inverter $I_1$ is formed of the PMOS transistor $M_3$ serially connected drain to drain with the NMOS transistor $M_4$. The gates of the PMOS transistor $M_3$ and the NMOS transistor $M_4$ are connected to be the input of the inverter $I_1$. The drains of the PMOS transistor $M_3$ and the NMOS transistor $M_4$ being the output of the inverter $I_1$. The source of the NMOS transistor $M_4$ is connected to the power supply connection pad 280 and the source of the PMOS transistor $M_3$ is connected to the diode $D_2$.

The output of the inverter $I_2$ that is in phase with the input of the group of serially connected inverters $I_1$, $I_2$, and $I_3$ is connected to the first gate of the SCR. The output of the inverter $I_3$ that is out of phase with the input of the group of serially connected inverters $I_1$, $I_2$, and $I_3$ is connected to the second gate of the SCR.

When an ESD event 285 occurs, the voltage at the signal input/output interface pad 285 increases dramatically. The top plate of the capacitor $C_1$ at the first gate is at a virtual ground, thus activating the group of serially connected inverters $I_1$, $I_2$, and $I_3$. This causes the transistors Q1 and Q2 to turn on, thus activating the SCR. The SCR then transfers the energy to the power supply connection pad 280. The group of serially connected inverters $I_1$, $I_2$, and $I_3$ provide a sharp transition and a clearly defined window when the SCR is turned on.

The diode $D_2$ is connected in series with the inverter $I_1$ to provide protection against accidental triggering of the ESD protection circuit during normal operation. The diode $D_1$ is placed in series with the SCR to increase the holding voltage of the ESD protection circuit. The diode $D_1$ may optionally be a group of serially connected diodes to adjust the holding voltage.

Figure 10:
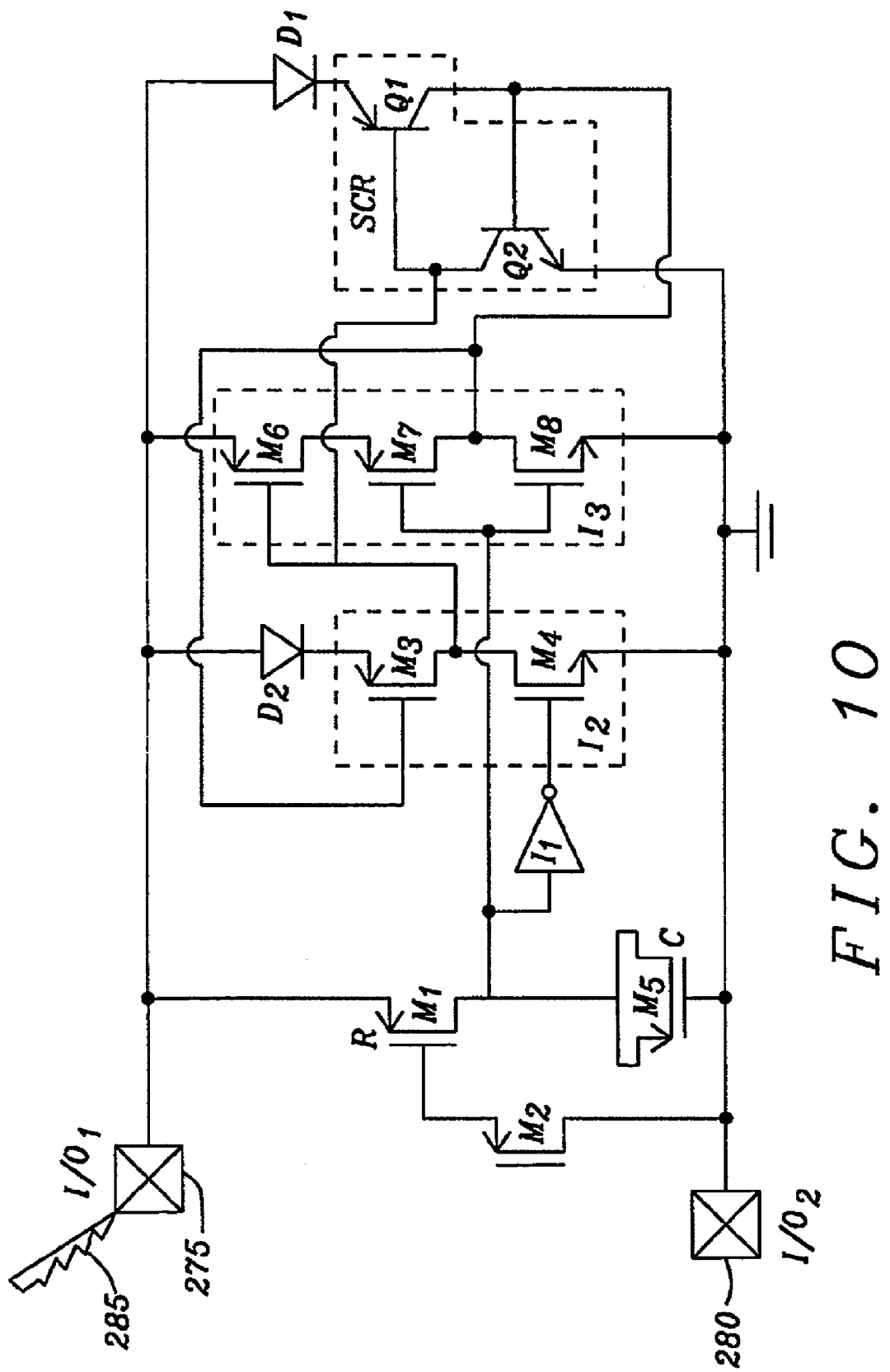
FIG. 10 is a schematic of a fourth diode triggered ESD protection circuit of this invention incorporating an ESD protection polysilicon bounded SCR structure.

A sixth embodiment of the ESD protection circuit, as shown in FIG. 10 is connected between the signal input/output interface pad 275 and the power supply connection pad 280. In this embodiment, the triggering bias circuit is a resistor R and capacitor C are formed of a first metal oxide semiconductor (MOS) transistor $M_1$ biased to act as the resistor R and a second MOS transistor $M_5$ connected to form the capacitor C. The MOS transistor $M_2$ connected to bias the MOS transistor $M_1$ to an on condition to act as the resistor R.

The SCR is formed as described in FIGS. 4a and 4b. The base of the transistor Q1 and the collector of the transistor Q2 is the N-well 205 of FIG. 4a and will be referred to as the first gate of the SCR. The base of the transistor Q2 and the collector of the transistor Q1 are the P-well 200 of FIG. 4a and are referred to as the second gate of the SCR.

The junction connection between the resistor R and capacitor C is connected to an input terminal of a first inverter $I_1$ and to the gates of the PMOS transistor $M_7$ and the NMOS transistor $M_8$ within the inverter $I_3$. The output of the inverter $I_1$ is connected to the gate of the NMOS transistor $M_4$.

The inverter $I_2$ is constructed of the PMOS transistor $M_3$ and the NMOS transistor $M_4$ having their drains connected together. The source of the NMOS transistor $M_4$ is connected to the power supply connection pad 280. The source of the PMOS transistors $M_3$ is connected to the anode of the diode $D_2$ and the cathode of the diode is connected to the signal input/output interface pad 275. The output of the inverter $I_2$ at the junction of the drains of the PMOS transistor $M_3$ and the NMOS transistor $M_4$ is connected to the first gate of the SCR and the gate of the PMOS transistor $M_6$.

The third inverter $I_3$ is constructed of the serially connected PMOS transistors $M_6$ and $M_7$ and the NMOS transistor $M_8$. The junction connection between the resistor R and the capacitor C is connected to the gates of the PMOS transistors $M_7$ and the NMOS transistor $M_8$, The output of the third inverter $I_3$ at the junction of the PMOS transistors $M_7$ and the NMOS transistor $M_8$ is connected to the second gate of the SCR and provide a weak feedback to the gate of the PMOS transistor $M_3$.

When an ESD event 285 occurs, the voltage at the signal input/output interface pad 275 increases dramatically. The top plate of the capacitor $C_1$ at the first gate is at a virtual ground, thus activating the group of serially connected inverters $I_1$, $I_2$, and $I_3$. This causes the transistors Q1 and Q2 to turn on, thus activating the SCR. The SCR then transfers the energy to the power supply connection pad 280. The weak feedback at the pullup of the PMOS transistor $M_3$ provides a sharp transition and a clearly defined window when the SCR is turned on.

The diode $D_2$ is connected in series with the inverter $I_1$ to provide protection against accidental triggering of the ESD protection circuit during normal operation. The diode $D_1$ is placed in series with the SCR to increase the holding voltage of the ESD protection circuit. The diode $D_1$ may optionally be a group of serially connected diodes to adjust the holding voltage.

The ESD protection circuit of this invention, as shown in the six embodiments, is preferably a polysilicon bounded SCR of this invention. The polysilicon bounded SCR of this invention provides a more compact device with a lower internal resistance. However, the ESD protection circuit of this invention, as shown in the four embodiments may have a shallow trench isolation bounded SCR as shown in FIG. 3. Further the diodes $D_1$ and $D_2$ of FIG. 6, diodes $D_1$, $D_2$, and $D_3$ of FIG. 7, and diodes $D_1$, $D_2$, $D_3$, $D_4$, and $D_5$ of FIG. 8 may be the shallow trench isolation bounded diodes as shown in FIG. 1. As is known in the art, the shallow trench isolation does not allow the small feature size achievable with the polysilicon bounded SCR or polysilicon bounded diodes. Further the depth of the shallow trench isolation forces the currents to travel farther through the bulk of the devices, thus increasing the series resistance of the devices and thereby the heating during an ESD event.

While this invention has been particularly shown and described with reference to the preferred embodiments thereof, it will be understood by those skilled in the art that various changes in form and details may be made without departing from the spirit and scope of the invention.

The invention claimed is:

1. A method for fabricating a silicon controlled rectifier on a substrate comprising the steps of:

forming a first well region lightly doped with impurities of a first conductivity type on a surface of said substrate;

forming a second well region within said first well region by lightly doping said second well region with impurities of a second conductivity type, said impurities of the second conductivity type having a polarity opposite the impurities of the first conductivity type;

forming a first diffusion region within said second well by heavily doping said first diffusion region with the impurities of the first conductivity type;

forming a second diffusion region within said first well region a distance from the first diffusion region by heavily doping said second diffusion region with impurities of the second conductivity type; and forming a heavily doped polycrystalline layer at the surface of said substrate and between the first and second diffusion regions and astride a junction of the first well region and the second well region to form a bounding component to prevent silicide formation at junctions of the first diffusion region and the second well region, the first well region and the second region, and the second diffusion region and the first well region during fabrication of said silicon controlled rectifier.

2. The method of claim 1 wherein said heavily doped polycrystalline layer permits a series resistance of said silicon controlled rectifier to be smaller for a more efficient operation.

3. The method of claim 1 further comprising the step of linking the first diffusion region to a voltage source which provides a relatively large voltage which when said relatively large voltage exceeds said snapback voltage, said silicon controlled rectifier conducts.

4. The method of claim 1 further comprises the step of connecting the heavily doped polycrystalline layer to bias said heavily doped polycrystalline silicon layer such that silicide shorting is prevented and preventing of accidental formation of an inversion region.

5. The method of claim 4 further comprising the step of connecting said heavily doped polycrystalline silicon layer to the second diffusion region.

6. The method of claim 5 further comprising the step of linking the first well region, the second well region, said highly doped polycrystalline silicon layer, and the second diffusion to a return of the voltage source.

7. The method of claim 6 wherein a first parasitic resistance formed within said first well region and a second parasitic resistance formed within said second well region act to bias a first and second gate of said silicon controlled rectifier to turn-on said silicon controlled rectifier.

8. A method for forming an ESD protection circuit formed at an input/output interface of an integrated circuit formed on a substrate to protect said integrated circuit from damage caused by an ESD event, said ESD protection circuit comprising:

forming a polycrystalline silicon bounded SCR on a surface of said substrate by the steps of:

forming a first well region lightly doped with impurities of a first conductivity type on a surface of said substrate, forming a second well region within said first well region by lightly doping said second well region with impurities of a second conductivity type, said impurities of the second conductivity type having a polarity opposite from the impurities of the first conductivity type, forming a first diffusion region within said second well by heavily doping said first diffusion region with the impurities of the first conductivity type, forming a second diffusion region within said first well region a distance from the first diffusion region by heavily doping said second diffusion region with impurities of the second conductivity type, and forming a heavily doped polycrystalline layer at the surface of said substrate and between the first and second diffusion regions and astride a junction of the first well region and the second well region to form a bounding component to prevent silicide formation at junctions of the first diffusion region and the second well region, the first well region and the second region, and the second diffusion region and the first well region during fabrication of said silicon controlled rectifier;

connecting said polycrystalline silicon bounded SCR between a signal input/output interface of said integrated circuit and a power supply connection of said integrated circuit;

forming a biasing circuit; and connecting said biasing circuit to said polycrystalline silicon bounded SCR to bias said polycrystalline silicon bounded SCR to turn on more rapidly during said ESD event; and wherein forming said biasing circuit comprises the steps of:

forming a first resistor from the signal input/output interface to a first gate of said polycrystalline silicon bounded SCR; and forming a first capacitor from the first gate of the polycrystalline silicon bounded SCR to said power supply connection;

wherein upon said ESD event, a top plate of said capacitor connected to said first gate of the polycrystalline bounded SCR virtually connected to said power supply connection and said polycrystalline silicon bounded SCR is activated.

9. A method for forming an ESD protection circuit formed at an input/output interface of an integrated circuit formed on a substrate to protect said integrated circuit from damage caused by an ESD event, said ESD protection circuit comprising:

forming a polycrystalline silicon bounded SCR on a surface of said substrate by the steps of:

forming a first well region lightly doped with impurities of a first conductivity type on a surface of said substrate, forming a second well region within said first well region by lightly doping said second well region with impurities of a second conductivity type, said impurities of the second conductivity type having a polarity opposite from the impurities of the first conductivity type, forming a first diffusion region within said second well by heavily doping said first diffusion region with the impurities of the first conductivity type, forming a second diffusion region within said first well region a distance from the first diffusion region by heavily doping said second diffusion region with impurities of the second conductivity type, and forming a heavily doped polycrystalline layer at the surface of said substrate and between the first and second diffusion regions and astride a junction of the first well region and the second well region to form a bounding component to prevent silicide formation at junctions of the first diffusion region and the second well region, the first well region and the second region, and the second diffusion region and the first well region during fabrication of said silicon controlled rectifier;

connecting said polycrystalline silicon bounded SCR between a signal input/output interface of said integrated circuit and a power supply connection of said integrated circuit;

forming a biasing circuit; and connecting said biasing circuit to said polycrystalline silicon bounded SCR to bias said polycrystalline silicon bounded SCR to turn on more rapidly during said ESD event; and wherein forming said biasing circuit comprises the steps of:

forming a resistor/capacitor biasing circuit by the steps of:

forming a first resistor from the signal input/output interface to a first gate of said polycrystalline silicon bounded SCR, and forming a first capacitor from the first gate of the polycrystalline silicon bounded SCR to said power supply connection, wherein upon said ESD event, a top plate of said capacitor connected to said first gate of the polycrystalline silicon bounded SCR virtually connected to said power supply connection and said polycrystalline silicon bounded SCR is activated, and forming a diode triggering biasing circuit by the steps of:

forming a plurality of serially connected diodes;

connecting a first diode of said plurality of serially connected diodes to the signal input/output interface, connecting a last diode of said plurality of serially connected diodes to a second gate of said polycrystalline silicon bounded SCR, and forming a second resistor from the second gate and the last diode of the plurality of serially connected diodes to the power supply connection, wherein an ESD event causes a current to flow through said plurality of serially connected diodes and said second resistor to trigger the polycrystalline silicon bounded SCR to turn on.

10. A method for forming an ESD protection circuit formed at an input/output interface of an integrated circuit formed on a substrate to protect said integrated circuit from damage caused by an ESD event, said ESD protection circuit comprising:

forming a polycrystalline silicon bounded SCR on a surface of said substrate by the steps of:

forming a first well region lightly doped with impurities of a first conductivity type on a surface of said substrate, forming a second well region within said first well region by lightly doping said second well region with impurities of a second conductivity type, said impurities of the second conductivity type having a polarity opposite from the impurities of the first conductivity type, forming a first diffusion region within said second well by heavily doping said first diffusion region with the impurities of the first conductivity type, forming a second diffusion region within said first well region a distance from the first diffusion region by heavily doping said second diffusion region with impurities of the second conductivity type, and forming a heavily doped polycrystalline layer at the surface of said substrate and between the first and second diffusion regions and astride a junction of the first well region and the second well region to form a bounding component to prevent silicide formation at junctions of the first diffusion region and the second well region, the first well region and the second region, and the second diffusion region and the first well region during fabrication of said silicon controlled rectifier;

connecting said polycrystalline silicon bounded SCR between a signal input/output interface of said integrated circuit and a power supply connection of said integrated circuit;

forming a biasing circuit; and connecting said biasing circuit to said polycrystalline silicon bounded SCR to bias said polycrystalline silicon bounded SCR to turn on more rapidly during said ESD event; and wherein forming said biasing circuit comprises the steps of:

connecting a diode between an inverter and said signal input/output interface of said integrated circuit to avoid unintended triggering of said ESD protection circuit.

11. A method for forming an ESD protection circuit formed at an input/output interface of an integrated circuit formed on a substrate to protect said integrated circuit from damage caused by an ESD event, said ESD protection circuit comprising:

forming a polycrystalline silicon bounded SCR on a surface of said substrate by the steps of:

forming a first well region lightly doped with impurities of a first conductivity type on a surface of said substrate, forming a second well region within said first well region by lightly doping said second well region with impurities of a second conductivity type, said impurities of the second conductivity type having a polarity opposite from the impurities of the first conductivity type, forming a first diffusion region within said second well by heavily doping said first diffusion region with the impurities of the first conductivity type, forming a second diffusion region within said first well region a distance from the first diffusion region by heavily doping said second diffusion region with impurities of the second conductivity type, and forming a heavily doped polycrystalline layer at the surface of said substrate and between the first and second diffusion regions and astride a junction of the first well region and the second well region to form a bounding component to prevent silicide formation at junctions of the first diffusion region and the second well region, the first well region and the second region, and the second diffusion region and the first well region during fabrication of said silicon controlled rectifier;

connecting said polycrystalline silicon bounded SCR between a signal input/output interface of said integrated circuit and a power supply connection of said integrated circuit;

forming a biasing circuit; and connecting said biasing circuit to said polycrystalline silicon bounded SCR to bias said polycrystalline silicon bounded SCR to turn on more rapidly during said ESD event;

forming a first parasitic resistance formed within said first well region and a second parasitic resistance within said second well region that may act to bias a first gate and a second gate of said polycrystalline silicon bounded SCR to turn-on said polycrystalline silicon bounded SCR.

12. A method for forming an ESD protection circuit formed at an input/output interface of an integrated circuit formed on a substrate to protect said integrated circuit from damage caused by an ESD event, said ESD protection circuit comprising:

forming a shallow trench isolation bounded SCR on a surface of said substrate;

connecting said shallow trench isolation bounded SCR between a signal input/output interface of said integrated circuit and a power supply connection of said integrated circuit;

forming a biasing circuit wherein forming said biasing circuit comprises the steps of:

forming a first resistor from the signal input/output interface to a first gate of said shallow trench isolation bounded SCR;

forming a first capacitor from the first gate of the shallow trench isolation bounded SCR to said power supply connection;

wherein upon said ESD event, a top plate of said first capacitor connected to said first gate of the shallow trench isolation bounded SCR virtually connected to said power supply connection and said shallow trench isolation bounded SCR is activated; and connecting said biasing circuit to said shallow trench isolation bounded SCR to bias said shallow trench isolation bounded SCR to turn on more rapidly during said ESD event.

13. The method of claim 12 wherein said biasing circuit: further comprises the steps of:

forming a plurality of serially connected diodes;

connecting a first diode of said plurality of serially connected diodes to the signal input/output interface;

connecting a last diode of said plurality of serially connected diodes to a second gate of said shallow trench isolation bounded SCR; and forming a second resistor from the second gate and the last diode of the plurality of serially connected diodes to the power supply connection;

wherein an ESD event causes a current to flow through said plurality of serially connected diodes and said second resistor to trigger the shallow trench isolation bounded SCR to turn on.

* * * * *